United States Patent
Lin et al.

(10) Patent No.: US 10,284,941 B2
(45) Date of Patent: May 7, 2019

(54) EARPHONE

(71) Applicant: MERRY ELECTRONICS (SHENZHEN) CO., LTD., Shenzhen (CN)

(72) Inventors: Chia Chung Lin, Taichung (TW); Jyun Neng Liao, Taichung (TW)

(73) Assignee: MERRY ELECTRONICS (SHENZHEN) CO., LTD., Shenzhen (CN)

(*) Notice: Subject to any disclaimer, the term of this patent is extended or adjusted under 35 U.S.C. 154(b) by 0 days.

(21) Appl. No.: 16/052,953

(22) Filed: Aug. 2, 2018

(65) Prior Publication Data
US 2019/0069071 A1     Feb. 28, 2019

Related U.S. Application Data

(60) Provisional application No. 62/552,007, filed on Aug. 30, 2017.

(51) Int. Cl.
| | | |
|---|---|---|
| *H04R 1/10* | (2006.01) | |
| *H04R 3/04* | (2006.01) | |
| *H03G 5/16* | (2006.01) | |

(52) U.S. Cl.
CPC .......... *H04R 1/1041* (2013.01); *H03G 5/165* (2013.01); *H04R 1/1016* (2013.01); *H04R 3/04* (2013.01); *H04R 2460/11* (2013.01)

(58) Field of Classification Search
CPC ...... H04R 1/1041; H04R 1/1016; H04R 3/04; H04R 2460/11; H03G 5/165; H03G 5/025
USPC ..... 381/56, 58, 74, 312, 94.2, 94.3, 98, 124, 381/103, 104
See application file for complete search history.

(56) References Cited

U.S. PATENT DOCUMENTS

| | | | | |
|---|---|---|---|---|
| 6,831,984 B2* | 12/2004 | Sapiejewski | ......... | H04R 1/2819 181/182 |
| 8,594,351 B2* | 11/2013 | Harlow | ................ | H04R 1/1016 381/309 |
| 8,750,552 B2* | 6/2014 | Baringa | .............. | H04R 1/2823 381/357 |
| 9,301,040 B2* | 3/2016 | Annunziato | ......... | H04R 1/1058 |
| 2013/0170691 A1* | 7/2013 | Baringa | .............. | H04R 1/2823 381/370 |

(Continued)

*Primary Examiner* — William A Jerez Lora
(74) *Attorney, Agent, or Firm* — Muncy, Geissler, Olds & Lowe, P.C.

(57) ABSTRACT

An earphone has a housing with a signal process unit to output sound. The housing has a chamber and a speaker mounted inside the chamber. The chamber is defined as a front volume and a rear volume by the speaker, and the rear volume having a port. Wherein the speaker in the volume outputting a chamber frequency response curve is at least a portion higher than the earphone's ideal frequency response curve at the bandwidth ranging from 20 Hz to 1000 Hz, where creates a gain difference between the chamber frequency response curve and the ideal frequency response curve to be decreased the (superfluous) positive value by a signal process unit at the bandwidth ranging from 20 Hz to 1000 Hz. Therefore, the total acoustic energy is maintained, the earphone acoustic quality is preserved, and the earphone volume may output even higher power to be deduced by the signal process unit for lowering down the circuit power consumption.

9 Claims, 3 Drawing Sheets

(56) References Cited

U.S. PATENT DOCUMENTS

2016/0007110 A1* 1/2016 Silvestri .............. H04R 1/2849
381/380
2018/0199129 A1* 7/2018 Zhao .................... H04R 1/1041

* cited by examiner

EARPHONE

BACKGROUND OF THE INVENTION

Field of the Invention

This invention relates to electroacoustic conversion technology, more specifically, to an earphone with a fine outputting acoustic quality and with a lower power consumption.

Description of the Related Art

For outputting a fine acoustic quality and for satisfying user's requirement during music experiencing, the earphone is preset an ideal frequency response curve to be comply with at the earphone designing process. Besides, another design challenge is to provide an earphone for long-time application in confined earphone size with limited battery capacity, the factories may only exert to upgrade the monomer efficiency or to reduce the circuit power consumption. At present, the prevalent way simply is to process the input electronical signal by sacrificing the outputting acoustic quality but the turning out effect of power reduction is still limited and to be improved.

SUMMARY OF THE INVENTION

In view of this, the aim of this invention is to provide an earphone capable of lowering down the power consumption of interior circuit and leaving the outputting acoustic quality intact.

This invention's provided earphone for outputting an ideal frequency response curve includes a housing, a chamber and a speaker mounted inside the chamber, and the chamber defined as a front volume and a rear volume, and the rear volume including a port, and a signal process unit electrically connected to the speaker. Wherein, the speaker in the chamber outputs a chamber frequency response curve and is a portion higher than the ideal frequency response cure at the bandwidth ranging from 20 Hz to 1000 Hz, where creates a gain difference between the chamber frequency response curve and the ideal frequency response curve to be decreased the (superfluous) positive value by the signal process unit according to the ideal frequency response curve at the bandwidth ranging from 20 Hz to 1000 Hz.

Because the design of the earphone chamber has a higher decibel value of chamber frequency response curve than that of the ideal frequency response curve for outputting circuit energy to be reduced by the signal process unit, it avoids the situation of changing a speaker. By way of that, the circuit's power consumption is reduced, the total audio energy is conserved and the acoustic quality of earphone is left intact.

DETAILED DESCRIPTION OF PREFERRED EMBODIMENTS

Figure 1:
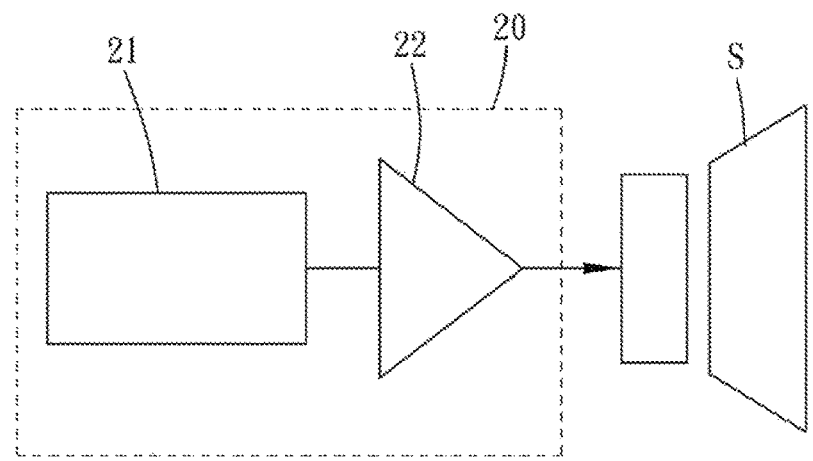
FIG. 1 illustrates a schematic block diagram in accordance with an embodiment of this invention.
Figure 2:
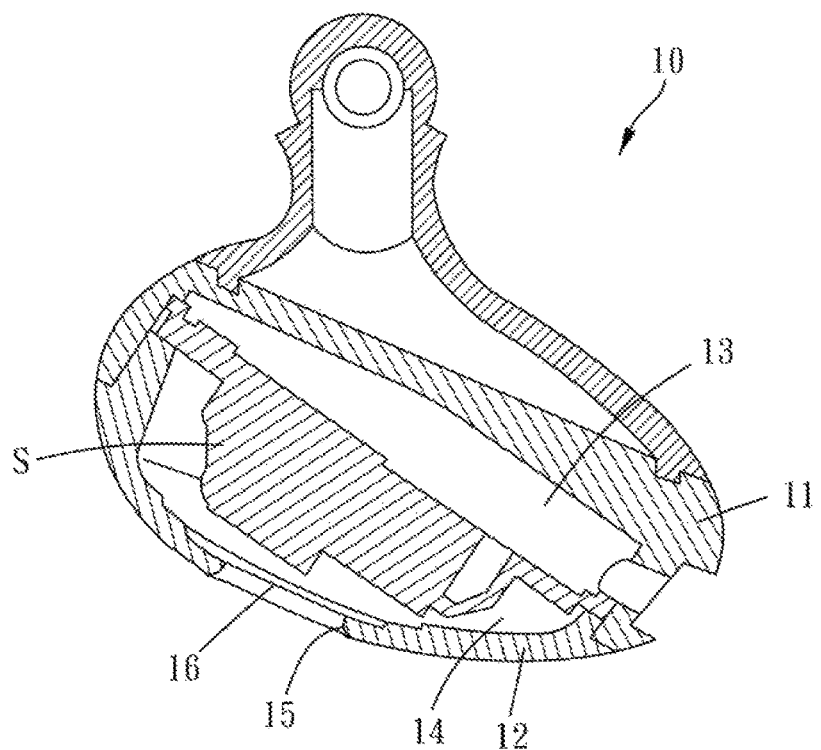
FIG. 2 is a schematic view in accordance with an embodiment of this invention.

To be more specifically illustrate the technical characteristics along with the effects of this invention, the drawings are referred to along with below mention, and the directional predicates such as "front" and "rear" are under technician's general comprehension who engaged in the related art. As shown in FIG. 1, the embodiment of this provided invention is an earphone having a housing 10 and a signal process unit 20.

The housing 10 is assembled by a front shell 11 docking a rear shell 12 and formed an internal chamber to accommodate a speaker S. At the same time, the speaker S is separated said chamber into a front volume 13 and a rear volume 14. Said rear volume 14 is unveiled with a vent through port 15 as for communicating the rear shell 12, and inside the rear volume 14 is equipped with a tuning part 16 shielded on the port 15 as for ventilation with dustproof and waterproof effects. In this embodiment, the total ventilation flow rate of the port 15 excesses than that of the conventional earphone, and the ventilation flow rate of rear volume 14 is more than 80% of the ventilation flow rate of the speaker S.

In other appropriate situation, the deployment of tuning part 16 is optional and may further be substituted by a solution of making the ventilation flow rate of rear volume surpass or equal to that of the speaker S.

The signal process unit 20 comprises an equalizer 21 assigned to receive the audio electronic signal for tuning, an amplifier 22 allocated to accept the tuned electronic signal for amplifying, and a speaker S arranged to output the amplified signal for acoustic propagation finally.

Figure 3:
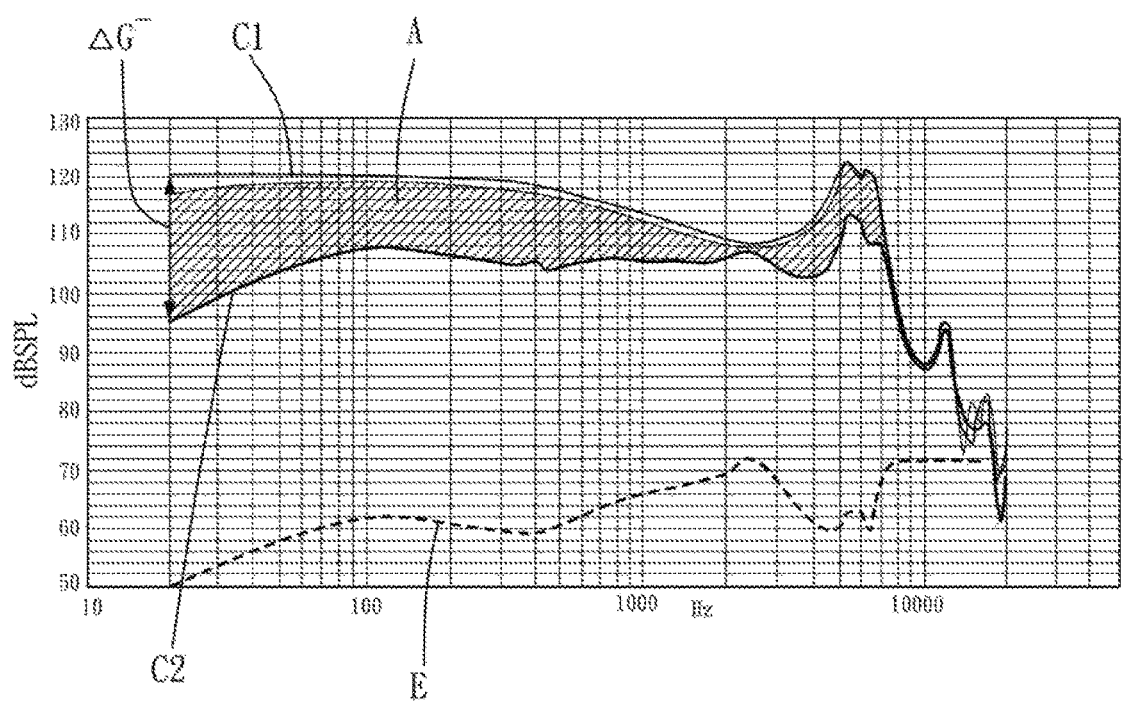
FIG. 3 is a frequency response curve in accordance with an embodiment of this invention.

As shown in FIG. 3, as the housing 10 adopts an open structure of rear volume 14 by way of enlarging the ventilation flow rate of rear volume 14 to strengthen the chamber frequency response curve C1 in Medium-Low Frequency. The decibel value of chamber frequency response curve is greatly increased in return at the bandwidth ranging from 20 HZ to 1000 Hz as the energy boost area A shown in FIG. 3.

However, concerning to maintain the acoustic quality during user's experiencing, the decibel value of predetermined ideal frequency response curve C2 is kept lower than that of the chamber frequency response curve C1 in Medium-Low Frequency output from the earphone, where creates a positive gain difference ΔG between the chamber frequency response curve C1 and the ideal frequency response curve C2 at the bandwidth of 20 Hz shown in FIG. 3. At the same time, the signal process unit 20 decreases the (superfluous) positive gain difference ΔG according to the ideal frequency response curve at each bandwidth ranging from 20 Hz to 1000 Hz. Moreover, the total energy difference is at least higher than 7 dB between the ideal frequency response curve C2 and the chamber frequency response curve C1 at the bandwidth ranging from 20 to 1000 Hz shown as the energy boost area A in FIG. 3. In this embodiment, that the equalizer 21 decays the input signal to be transmitted to the speaker for outputting audio signal leads the equalization curve E to be in accordance with the ideal frequency response curve C2 as shown in FIG. 3.

As the rear volume 14 retains a higher resonance energy, the earphone in this embodiment may efficiently decrease the power consumption output from the signal process unit 20. In this embodiment, the electric current distributed by the signal process unit 20 may be reduced by 1 mA on average on condition that the acoustic output power are the same at the bandwidth ranging from 20 Hz to 1000 Hz. When the battery capacity is 140 mAh, it prolongs the time of application for about 50 minutes which is to say that the battery consumption is reduced by about 20 mAh on condition that the time for application are the same. Therefore, the power reduction effect is quite evident which is discovered after actual experiencing measurement compared to the traditional earphone design.

To make a supplementary of the other situation, the decibel value of the chamber frequency response curve C1 may be a portion higher than that of the ideal frequency response curve C2 at the bandwidth ranging from 20 Hz to 1000 Hz. In other words, there may as well be a portion corresponding bandwidth of the gain difference ΔG lower or equal to zero. Then the signal process unit may only decay the (superfluous) positive gain difference at the bandwidth ranging from 20 Hz to 1000 Hz for realizing the technical effect of lower circuit power consumption.

Figure 4:
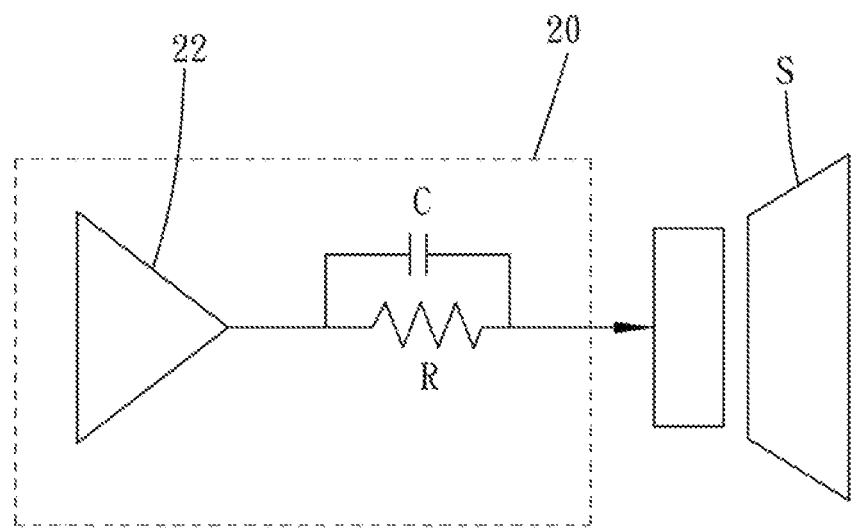
FIG. 4 is another schematic block diagram in accordance with an embodiment of this invention.

This invention provide another earphone embodiment as shown in FIG. 4, the main structure is mostly the same as the embodiment but the core difference lies in: the signal process unit 20 refuses adopting an amplifier 22 and instead deploys a signal process circuit constituted by a resistance R in parallel with a capacitance C acting for decaying the gain difference at the bandwidth ranging from 20 Hz to 1000 Hz turning out the same technical effect of earphone power reduction.

What is claimed is:

1. An earphone for outputting sound based on a predetermined ideal frequency response curve for the earphone, comprising:

a housing having a chamber and a speaker mounted in said chamber to define a front volume and a rear volume, said housing including a port; and a signal process unit, being electrically connected to said speaker, wherein, said speaker in the chamber outputs sound based on a chamber frequency response curve, wherein the chamber frequency response curve indicates actual measurement of maximum output power of the speaker mount in the chamber at each frequency, wherein a decibel value of said chamber frequency response curve is configured at least a portion higher than a decibel value of said predetermined ideal frequency response curve at the bandwidth ranging from 20 Hz to 1000 Hz, thereby a positive gain difference is formed, and wherein the positive gain difference is decreased by said signal process unit according to said predetermined ideal frequency response curve at the bandwidth ranging from 20 Hz to 1000 Hz.

2. The earphone as claimed in claim 1, wherein a ventilation flow rate of said rear volume is higher or equal to a ventilation flow rate of said speaker.

3. The earphone as claimed in claim 1, wherein said rear volume is mounting a tuning part covering over said port, and a ventilation flow rate of said rear volume is 80% higher or equal to a ventilation flow rate of said speaker.

4. The earphone as claimed in claim 1, wherein said signal process unit includes an equalizer.

5. The earphone as claimed in claim 4, wherein said signal process unit contains an amplifier located in between said equalizer and said speaker.

6. The earphone as claimed in claim 1, wherein said signal process unit is a signal process circuit having a resistance in parallel with a capacitance.

7. The earphone as claimed in claim 6, wherein said signal process circuit is deployed in between an amplifier and said speaker.

8. The earphone as claimed in claim 1, wherein the decibel value of said chamber frequency response curve is higher than the decibel value of said ideal frequency response curve at the bandwidth ranging from 20 Hz to 1000 Hz.

9. The earphone as claimed in claim 1, wherein an energy difference is at least higher than 7 dB between said ideal frequency response curve and said chamber frequency response curve at the bandwidth ranging from 20 to 1000 Hz.

* * * * *